United States Patent [19]

Kimble et al.

[11] Patent Number: 4,944,592
[45] Date of Patent: Jul. 31, 1990

[54] DEVICE AND METHOD FOR QUANTUM NONDEMOLITION MEASUREMENTS USING PARAMETRIC OSCILLATION

[75] Inventors: Harry J. Kimble, Austin, Tex.; Silvania F. Pereira, Campinas, Brazil; Daniel F. Walls, Auckland, New Zealand

[73] Assignee: The University of Texas System, Austin, Tex.

[21] Appl. No.: 333,869

[22] Filed: Apr. 4, 1989

Related U.S. Application Data

[63] Continuation of Ser. No. 109,218, Oct. 16, 1987, abandoned.

[51] Int. Cl.$^5$ .................................................. G01J 4/00
[52] U.S. Cl. .................................................... 356/364
[58] Field of Search ........................................ 356/364

[56] References Cited

FOREIGN PATENT DOCUMENTS 0138452 4/1985 European Pat. Off. .

OTHER PUBLICATIONS

V. B. Braginsky et al., *Quantum Nondemolition Measurements, Science*, vol. 209, No. 4456, pp. 547–557 (1 Aug. 1980).
M. Hillery et al., *Quantum Noise and Quantum Nondemolition Measurements, Physical Review D*, vol. 25, No. 12, pp. 3137–3158 (15 Jun. 1982).
G. J. Millburn et al., *Quantum Nondemolition Measurements on Coupled Harmonic Oscillators, Physical Review A*, vol. 27, No. 6, pp. 2804–2816 (Jun. 1983).
B. Yurke, *Optical Back-Action-Evading Amplifiers, Journal of the Optical Society of America B*, vol. 2, No. 5, pp. 732–738 (May 1985).
B. G. Levi, *Squeezing the Quantum Noise Limits, Physics Today*, pp. 17–19 (Mar. 1986).
M. D. Levenson et al., *Quantum Nondemolition Detection of Optical Quadrature Amplitudes, Physical Review Letters*, vol. 57, No. 20, pp. 2473–2476 (17 Nov. 1986).
S. F. Pereira et al., *Quantum Non-Demolition Measurements in the Nondegenerate Optical Parametric Oscillator, Abstract, Optics News*, vol. 13, No. 9, p. 102 (Sep. 1987).
Slusher et al., "Squeezed Light" *Scientific American*, vol. 258, No. 5 (May 1988), pp. 50–56.
Ling-An Wu et al., *Generation of Squeezed States by Parametric Down Conversion, Physical Review Letters*, vol. 57, No. 20, pp. 2520–2523 (17 Nov. 1986).
A. M. Smith, *Noise Reduction in Optical Measurement Systems, IEE Proceedings*, vol. 125, No. 10, pp. 935–941 (Oct. 1978).

*Primary Examiner*—Richard A. Rosenberger
*Attorney, Agent, or Firm*—Larry W. Evans; Joseph G. Curatolo; Teresan W. Gilbert

[57] ABSTRACT

Quantum nondemolition measurements are made by back-action evasion obtained by a combination of a parametric oscillation and a conversion of polarizations. A polarization converter (14, 16, 17), such as a Faraday rotator, converts at substantially a single frequency between at least a portion of a signal polarization state and a detector polarization state. A parametric amplifier (11) having a gain G is coupled to the polarization converter (14, 16, 17).

7 Claims, 1 Drawing Sheet

DEVICE AND METHOD FOR QUANTUM NONDEMOLITION MEASUREMENTS USING PARAMETRIC OSCILLATION

This is a continuation of application Ser. No. 07/109,218, filed Oct. 16, 1987, now abandoned.

TECHNICAL FIELD

The present invention relates generally to measurements modifying the quantum fluctuations of an electromagnetic field, thereby reducing noise below the level of fluctuations associated with variations of an electromagnetic field in a vacuum state. More particularly, the present invention relates to quantum nondemolition measurements made by back-action evasion. Still more specifically, the present invention relates to back-action evasion obtained by a combination of parametric oscillation and a conversion of polarizations.

BACKGROUND ART

It is well known that a mode of an electromagnetic ("EM") field may be described as the sum of two quadrature components whose time variations are given by sine and cosine functions, respectively. The amplitude of each quadrature component is a variable having a complementary and uncertainty relationship with the other. The variances in these components and the resulting variations in the EM field in a vacuum state having long been recognized to generate a "shot noise" level providing a limit on the precision of measurements made with an EM field.

Quantum mechanics has appreciated that the noise level can be reduced below the shot level by making the variances unequal; reduced fluctuations in one quadrature may be achieved by increasing the fluctuations in another quadrature (the so-called "squeezed states"). Such reductions would make possible significant advances in the precision of any EM field dependent measurement or process, such as spectroscopy, interferometry, communications and information storage.

Measurement techniques which avoid inducing fluctuations in the characteristic to be measured are called quantum nondemolition ("QND") measurements because such techniques ideally do not perturb or destroy the quantum property being examined. The nature of QND measurement has been discussed in such publications as Braginsky, et al., *Quantum Nondemolition Measurements*, Science, pp. 547–557, Vol. 209, No. 4456 (1 Aug. 1980); Hillery, et al., *Quantum noise and quantum nondemolition measurements*, Physical Review D, pp. 3137–3158, Vol. 25 No. 12 (15 June 1982); and, Milburn, et al., *Quantum nondemolition measurements on coupled harmonic oscillators*, Physical Review A, pp. 2804–2816, Vol. 27, No 6 (June 1983).

One successful QND measurement technique involves monitoring one quadrature component of an EM field while noise arising as a result of such monitoring is added entirely into a second quadrature component of the EM field. Because this measurement process evades the injection of noise back into one quadrature component of the EM field, in it is commonly referred to as "back-action evasion".

Several back-action evading ("BAE") schemes for achieving QND measurement in the optical region of the EM spectrum are illustrated in the article by B. Yurke entitled "*Optical back-action-evading amplifiers*", J. Opt. Soc. Am. B, pp. 732–738, Vol. 2, No. 5 (May 1985), which article is hereby incorporated by reference. One BAE scheme presented in Yurke involves pumping a nonlinear medium at the sum and difference of two different frequencies (which are referred to by Yurke as the signal frequency and readout frequency). As explained in Section 4 of the Yurke article, optical BAE may be achieved by the combination of frequency converting and parametrically amplifying both the input and output light beams. However, the complexity of frequency converters and their potential for introduction of additional sources of noise make this approach difficult to implement as a practical QND measurement device.

We have found a simple scheme for QND measurements in which BAE is accomplished by the conversion of polarizations of the EM field with parametric amplification.

DISCLOSURE OF THE INVENTION

It is, therefore, an object of the invention to provide a device and method for QND measurement that is simple to implement.

It is another object of the invention to provide a device and method, as above, in which the introduction of extraneous noise is minimized.

It is still another object of the invention to provide a device and method, as above, which allows for the substantially noise-free measurement of he quadrturephase amplitudes without affecting the measured quadrature.

It is yet another object of the invention to provide a device and method, as above, in which BAE is accomplished in a parametric-gain medium coupled to an intracavity device for the conversion of polarizations at substantially a single frequency of the EM field (within the cavity linewidth).

It is a further object of the invention to provide a device and method, as above, where such intracavity device operates in the optical region of the EM spectrum.

These and other objects and advantages of the present invention over existing prior art forms will become more apparent and fully understood from the following description in conjunction with the accompanying drawings.

In general, a device for measurement of a characteristic of an electromagnetic field includes means for converting at substantially a single frequency between at least a portion of a first polarization state of the electromagnetic field and at least a portion of second polarization state of the electromagnetic field; and, means for parametrically amplifying the polarization states having a gain G, the means for parametrically amplifying coupled to the means for converting, the magnitude of converting between the first polarization state and the second polarization state is a function of the gain G, permitting a quantum nondemolition measurement of the characteristic.

A method for measurement of a characteristic of an electromagnetic field includes the steps of converting at substantially a single frequency between at least a portion of a first polarization state of the electromagnetic field and at least a portion of a second polarization state of the electromagnetic field; and, parametrically amplifying the polarization states with a gain G, the magnitude of converting between the first polarization state and the second polarization state is a function of the gain G, permitting a quantum nondemolition measurement of the characteristic.

PREFERRED EMBODIMENT FOR CARRYING OUT THE INVENTION

Figure 1:
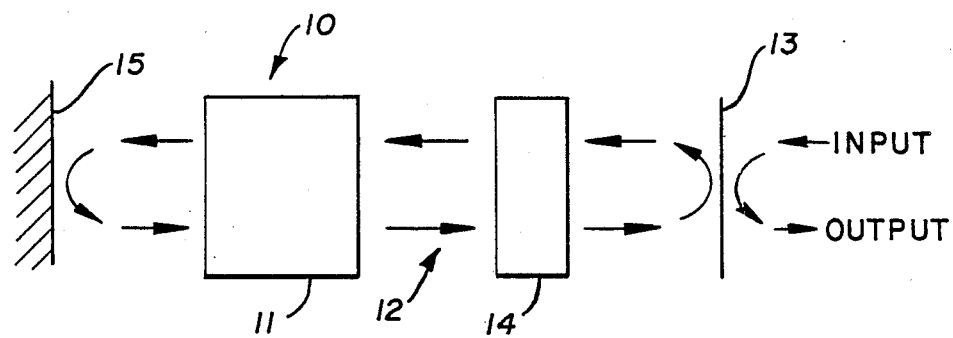
FIG. 1 is a block diagram of an exemplary device, and embodied method, for QND measurement in accordance with the concept of the present invention.

FIG. 1 depicts an exemplary device, generally indicated by the numeral 10, and embodied method, for QND measurement in accordance with the concept of the present invention. Device 10 includes: a parametric amplifier 11 such as a sub-threshold parametric oscillator within an optical cavity 12 that includes a nonlinear medium and a polarization converter 14 for the conversions of polarizations, such as a Faraday rod, which induces Faraday rotation in the polarization of the EM field by some angle $\theta$. (A suitable sub-threshold parametric oscillator has been described in the article by Wu, et al., entitled "GENERATION OF SQUEEZED STATES BY PARAMETRIC DOWNCONVERSION," *Physical Review Letters*, pp. 2520–2523, Vol. 57, No. 20 (17 Nov. 1986).) In the embodiment shown in FIG. 1 the input EM field which includes a signal light beam (the beam to be measured) and a meter light beam (the detector beam) propagating at a signal frequency and a meter frequency, respectively, enters cavity 12 after passing through beam splitter 13, is rotated in polarization by means such as Faraday rod 14, amplified by parametric amplifier 11 having a gain G, and reflected by fold mirror 15 back through parametric amplifier 11. The reflected output again passes through polarization converter 14 and exits cavity 11.

Figure 2:
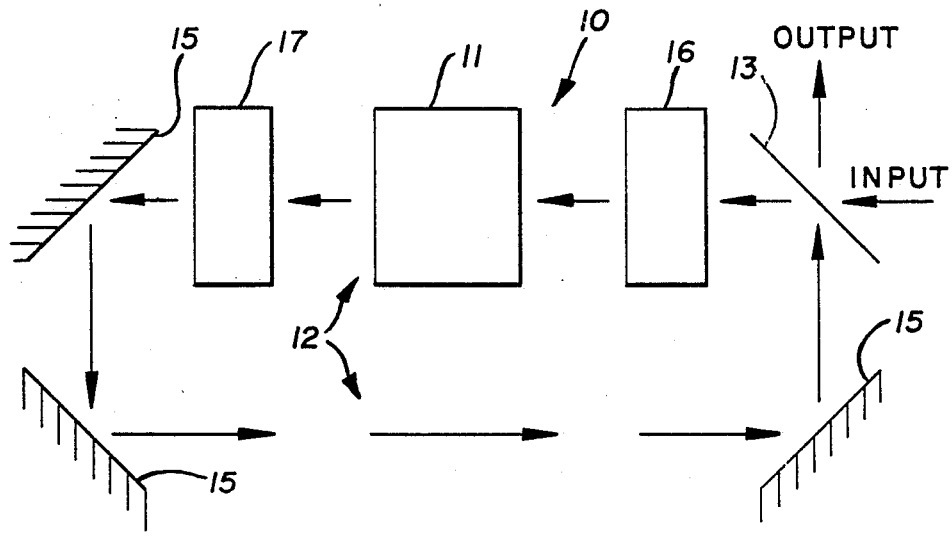
FIG. 2 is a block diagram of an alternative exemplary device, and embodied method for QND measurement in accordance with the concept of the present invention.

In the embodiment shown in FIG. 2 the signal and meter light beams pass through a beam splitter 13 and a first polarization converter 16, the parametric amplifier 11, and a second polarization converter 17, and is directed outside the cavity 12 by a plurality of fold mirrors 15.

It should be appreciated that with the signal light beam and meter light beam at subtantially the same frequency (within the linewidth of cavity 12), parametric amplifier 11 (which may employ either Type I or Type II polarization states) is pumped at twice the frequency $\omega$ and the action of conversion is achieved by the rotation of the light beam polarization.

In this configuration there exists two orthogonal polarization states, with one polarization state of the subharmonic serving as the signal and one polarization state serving as the detector or meter of the signal. One quadrature component of the signal is an ideal QND variable. As the pumping levels increase (and polarization converter 17 correspondingly alters the magnitude of the conversion) one quadrature of the meter light beam can be measured with a noise level that approximates that of the original signal light beam.

Inasmuch as the present invention is subject to variations, modifications and changes in detail, a number of which have been expressly stated herein, it is intended that all matter described throughout this entire specification or shown in the accompanying drawings be interpreted as illustrative and not in a limiting sense. It should thus be evident that a device constructed according to the concept of the present invention, and reasonably equivalent thereto, will accomplish the objects of the present invention and otherwise substantially improve the art of providing QND measurements using parametric oscillation.

We claim:

1. A device for measurement of a characteristic of an electromagnetic field, comprising:
   means for converting at substantially a single frequency between at least a portion of the electromagnetic field in a first polarization state and at least a portion of the electromagnetic field in a second polarization state; and,
   means for parametrically amplifying said polarization states having a gain G, said means for parametrically amplifying coupled to said means for converting, the magnitude of converting between said first polarization state and said second polarization state a function of said gain G.

2. A device for measurement of a characteristic of an electromagnetic field, as set forth in claim 1, wherein said first polarization state is the signal to be measured and said second polarization state is the detector of said signal.

3. A device for measurement of a characteristic of an electromagnetic field, as set forth in claim 2, wherein said means for converting includes means for inducing a Faraday rotation in the portion of the electromagnetic field in said first polarization state and in the portion of the electromagnetic field in said second polarization state.

4. A device for measurement of a characteristic of an electromagnetic field, as set forth in claim 3, wherein said means for inducing a Faraday rotation is a Faraday rod.

5. A method for measurement of a characteristic of an electromagnetic field, comprising the steps of:
   converting at substantially a single frequency between at least a portion of the electromagnetic field in a first polarization state and at least a portion of the electromagnetic field in a second polarization state; and,
   parametrically amplifying said polarization states having a gain G, said means for parametrically amplifying coupled to said means for converting, the magnitude of converting between said first polarization state and said second polarization state a function of said gain G.

6. A method for measurement of a characteristic of an electromagnetic field, as set forth in claim 5, wherein said step of converting includes the step of inducing a Faraday rotation in the portion of the electromagnetic field in said first polarization state and in the portion of the electromagnetic field in said second polarization state.

7. A method for measurement of a characteristic of an electromagnetic field, as set forth in claim 5, wherein said step of converting includes the steps of performing a first said conversion prior to said step of parametrically amplifying and performing a second said conversion after said step of parametrically amplifying.

* * * * *